(12) United States Patent
Guenther et al.

(10) Patent No.: US 6,936,856 B2
(45) Date of Patent: Aug. 30, 2005

(54) MULTI SUBSTRATE ORGANIC LIGHT EMITTING DEVICES

(75) Inventors: Ewald Guenther, Singapore (SG); Charles Lee Wee Ming, Singapore (SG)

(73) Assignees: Osram Opto Semiconductors GmbH, Regensburg (DE); Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/051,867

(22) Filed: Jan. 15, 2002

(65) Prior Publication Data

US 2003/0132446 A1 Jul. 17, 2003

(51) Int. Cl.⁷ .......................... H01L 33/00; H05B 33/00
(52) U.S. Cl. ........................................................ 257/89
(58) Field of Search ............................. 257/79, 88, 89, 257/90, 91, 99; 438/34, 35, 67, 107

(56) References Cited

U.S. PATENT DOCUMENTS

| | | | |
|---|---|---|---|
| 5,583,350 A | * 12/1996 | Norman et al. | ............... 257/88 |
| 5,703,436 A | 12/1997 | Forrest et al. | |
| 5,739,552 A | * 4/1998 | Kimura et al. | ................. 257/89 |
| 5,965,907 A | * 10/1999 | Huang et al. | .................. 257/89 |
| 6,060,727 A | * 5/2000 | Shakuda | ...................... 257/90 |
| 6,117,529 A | * 9/2000 | Leising et al. | .............. 428/209 |
| 6,211,538 B1 | * 4/2001 | Park | ............................. 257/88 |
| 6,316,786 B1 | 11/2001 | Mueller et al. | |
| 6,329,085 B1 | * 12/2001 | Burrows et al. | ............ 428/690 |
| 6,639,249 B2 | * 10/2003 | Valliath | ........................ 257/88 |
| 6,730,937 B2 | * 5/2004 | Dai et al. | ...................... 257/89 |
| 2001/0000005 A1 | 3/2001 | Forrest et al. | |
| 2002/0079834 A1 | * 6/2002 | Dai et al. | ................... 313/506 |
| 2002/0135296 A1 | * 9/2002 | Aziz et al. | .................. 313/504 |

FOREIGN PATENT DOCUMENTS

| | | |
|---|---|---|
| WO | WO 00 29779 | 5/2000 |
| WO | WO 01/04938 A1 | 1/2001 |
| WO | WO 01 45140 | 6/2001 |

OTHER PUBLICATIONS

Hebner, T.R. et al., "Ink–Jet Printing of Doped Polymers for Organic Light Emitting Devices", Applied Physics, Letters, vol. 72, No. 5, Feb. 2, 1998, pp. 519–521.

Burrows, P.E. et al., "Color–Tunable Pixels and Lasers Using Vacuum–Deposited Organic Thin Films", SPIE, vol. 3148, 0277–786X/97, pp. 252–263.

Pschenitzka, F. et al., Three–Color Organic Emitting Diodes Patterned by Masked Dye Diffusion, Applied Physics, Letters vol. 74, No. 13, pp. 1913–1915.

* cited by examiner

*Primary Examiner*—Craig A. Thompson
*Assistant Examiner*—Jennifer M Dolan
(74) *Attorney, Agent, or Firm*—Fish & Richardson P.C.

(57) ABSTRACT

An OLED device capable of emitting multiple colors is disclosed. In one embodiment of the invention, multiple substrates are stacked upon one another, wherein the different substrates emit light of a given color. In another embodiment of the invention, these substrates are separated by spacer particles to prevent the overlying substrates from contacting the active components.

27 Claims, 7 Drawing Sheets

MULTI SUBSTRATE ORGANIC LIGHT EMITTING DEVICES

FIELD OF THE INVENTION

The present invention relates to organic light emitting diode (OLED) devices. More particularly, the invention relates to multi color and full color OLED devices.

BACKGROUND OF THE INVENTION

FIG. 1 shows a conventional monochrome OLED device 100. The OLED device comprises a functional stack of one or more organic functional layers 104 between a conductive cathode layer 102 and an anode layer 106. The functional stack is formed on a transparent substrate 108. The conductive layers can be patterned to form one or more cells or pixels on the substrate. In operation, charge carriers are injected through the cathodes and anodes for recombination in the functional layers. The recombination of the charge carriers causes the functional layer to emit visible radiation.

The basic advantages of OLED devices are low driving voltage, low power consumption, large viewing angle, high contrast, fast response, rugged design and the potential for low manufacturing costs. To fully utilize these advantages of OLED devices and for potential applicability to color flat panel displays, multi color and full color versions can be produced.

There are several methods to fabricate color displays: a broadband (i.e. white) emitter and color filters, a short wavelength (i.e. blue) emitter and down-converter for green and red emitters, organic materials which emit different colors on the same substrate, and microcavity structures for spectral filtering, masked diffusion of dye materials or selective laser bleaching of dyes.

All of these methods suffer from drawbacks related to material unavailability, power inefficiency, image distortion, costly and inefficient fabrication, reduced performance and other reasons. For example, there is hardly any efficient and stable broadband emitter available. The use of color conversion materials results in image distortions and less brilliant displays. Generating pixels on a single substrate surface with different light emitting organic materials usually results in loss in device performance and spatial resolution. Ink-jet printing is one approach but it is essentially a serial process that results in low resolution and low production throughput.

Another approach is to stack layers of different emitting heterostructure devices on a single substrate surface. One known example of a multicolor OLED device employing a vertical stacked structure is disclosed in Forrest et al, U.S. Patent Application 20010000005. The main drawback is that the materials used for the stacked structure have to be substantially transparent with low optical absorption, since the beam of light from each device is wholly coincident with the others, hence imposing many constraints on the device architecture.

As evidenced from the discussion above, it is desirable to provide an improved fabrication process designed for efficient production of multi and full color OLED devices.

SUMMARY OF THE INVENTION

The invention relates generally to OLED devices. In particular, the invention relates to color OLED devices comprising multiple substrates.

In accordance with the invention, multiple substrates including active components are stacked upon each other, each substrate emitting light of a given wavelength or color. In other embodiments, a substrate without active components can be provided between two substrates with active components. The active components are distributed on either one surface or both surfaces of each substrate. In one embodiment of the invention, the surfaces of the substrates are punctured and staggered to bring the emitting levels to a similar height. In one embodiment, the substrates are separated by spacer particles to prevent the overlying substrates from contacting the active components.

The invention overcomes inherent problems like loss in efficiency, image distortions, material unavailability, costly and inefficient fabrication and reduced performance associated with other techniques.

PREFERRED EMBODIMENTS OF THE INVENTION

Figure 1:
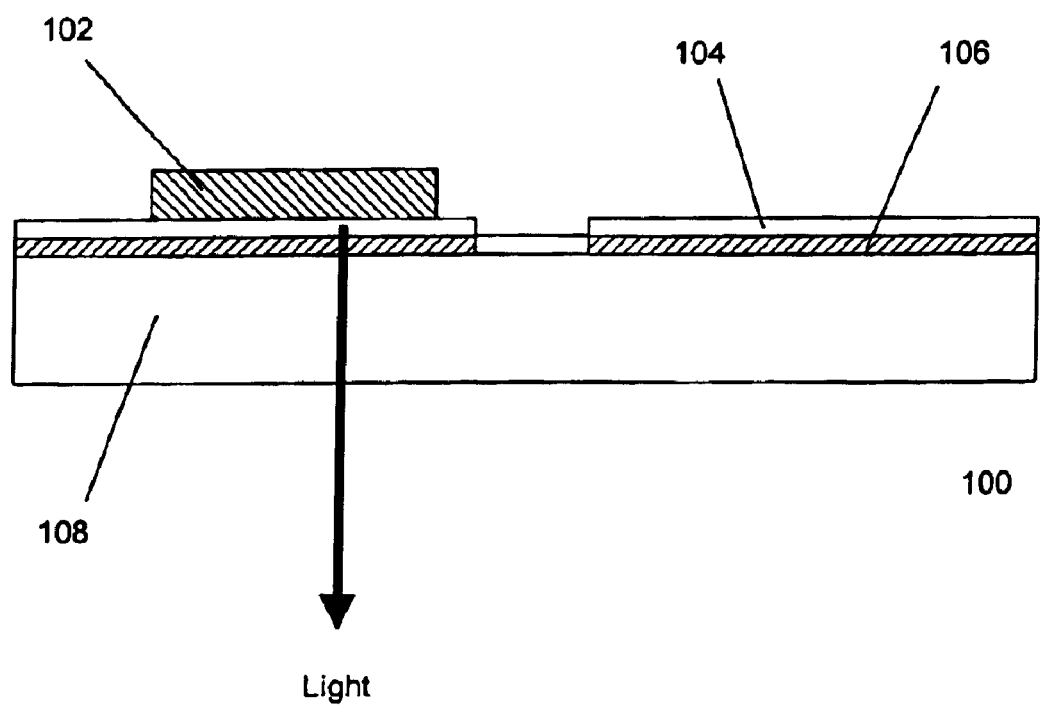
FIG. 1 shows a conventional monochrome OLED device.

FIG. 1 shows a conventional monochrome OLED device and has been previously described. The basic fabrication process for the monochrome device is used in this invention to form a multi-color OLED device, as will be described.

Figure 2:
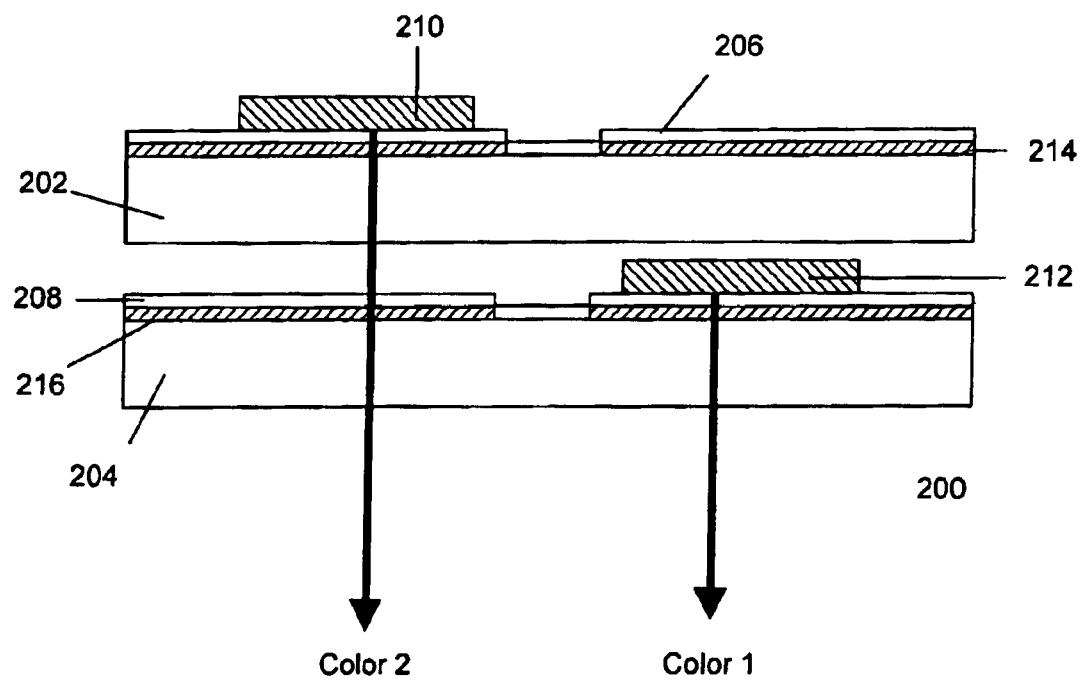
FIG. 2 shows a two-substrate OLED device in accordance with one embodiment of the invention.

FIG. 2 shows a thin flexible OLED device 200 according to one embodiment of the invention. The OLED device comprises multiple substrates on which active components are formed in the device region thereof. Active components on the upper substrate 202 comprise one or more organic layers 206 sandwiched between two conductive layers 210 and 214. Similarly, the OLED active components on the lower substrate 204 comprise one or more organic layers 208 formed between two conductive layers 212 and 216. In one embodiment, the conductive layers are formed as strips in respective first and second directions. Typically, the first and second directions are orthogonal to each other. The OLED pixels are formed in the device region of the substrate.

The substrates 202 and 204, in one embodiment, comprise a transparent material, such as plastic or glass. Other materials that can adequately support the OLED cells can also be used to form the substrates. In one embodiment, the substrates comprise a flexible material, such as a plastic film for forming a flexible device. Various commercially available plastic films can be used to serve as the substrate. Such films, for example, include transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate.

Typically, the thickness of the thin substrates is less than about 0.5 mm each, preferably about 0.01–0.2 mm. The use of thin or ultra-thin substrates advantageously reduces or minimizes parallaxes caused by light emission at different heights. In some cases, the thin substrates may be mechanically unstable, creating processing problems. A temporary support layer (not shown) can be employed to stabilize the substrate during the fabrication process. The temporary support layer, for example, can be provided on the backside of the substrate. In one embodiment, the temporary support layer comprises a polymer foil coated with an adhesive for attaching to the substrate. After processing, the temporary layer is removed since the device package can be used to mechanically stabilize the device.

In one embodiment, the conductive layers 214 and 216 comprise a transparent conductive material, such as indium-tin-oxide (ITO). Other types of transparent conductive layers, including zinc-oxide and indium-zinc-oxide, are also useful. Alternatively, only one of the two conductive layers is transparent. The transparent conductive layer is placed adjacent to the viewing surface, allowing light from the active component to be visible. For example, the transparent layer is placed adjacent to the substrate through which light is viewed. Alternatively, the upper electrode is the transparent electrode. Various techniques, such as chemical vapor deposition (CVD), physical vapor deposition (PVD), and plasma enhanced CVD (PECVD), can be employed to form the conductive layer. The conductive layer should be thin to reduce optical absorption and negative impact on subsequent film formation while satisfying electrical requirements. The conductive layer is typically about 0.02–1 $\mu$m thick.

The conductive layers 214 and 216 are patterned as desired to selectively remove portions of the layer. The patterned conductive layers serve as first electrodes for the OLED cells. In one embodiment, the conductive layers are patterned to form strips that serve as, for example, anodes of a pixelated OLED device. Conventional techniques, such as photolithography and etching, can be used to pattern the conductive layer. Patterning techniques using a stamp are also useful. Such techniques are described international patent application titled "Mechanical Patterning of a Device Layer" (PCT Application No. PCT/SG99/00074, Attorney docket number 99E 8062), which is herein incorporated by reference for all purposes.

The active components 206 and 208 comprise one or more organic functional layers formed on the substrates. The functional layers are fabricated from organic compounds selected for their ability to emit different colors. The organic compounds include, for example, conjugated polymer or low molecular materials such as Alq$_3$. In one embodiment, the organic compounds comprise MEH-PPV(=methoxy-ethylhexyloxy-PPV) which emits orange light. In another embodiment, the organic compounds include red-emitting CN-PPV(=cyano substituted PPV) or blue-emitting 9,9-dimethyl-substituted polyfluorene PPP(=poly-para-phenylene) polymers. Other types of functional organic layers are also useful. The organic functional layers can be formed by conventional techniques, for example, wet processes such as spin coating or vacuum sublimation (for Alq3 organic layers). The thickness of the organic layers is typically about 2–200 nm.

Conductive layers 210 and 212 are deposited on the substrates, covering the other layers formed thereon. The conductive layers comprise, for example, a metallic material such as Ca, Mg, Ba, Ag or a mixture or alloy thereof. Other conductive materials, particularly those which comprises a low work function, can also be used to form the second conductive layer. The conductive layer should be thin to reduce optical absorption and negative impact on subsequent film formation while satisfying electrical requirements. The conductive layer is typically about 0.02–1 $\mu$m thick.

In one embodiment, the conductive layers 210 and 212 are patterned to form electrode strips that serve as cathodes for a pixelated OLED device. Forming electrodes having other patterns is also useful. Alternatively, the conductive layers can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels on each substrate.

The substrate and anode layers are sufficiently transparent for multi-substrate applications. The cathode material, however, is typically opaque and requires a suitable pattern to allow emitted light to pass through the substrates. In the embodiment shown in FIG. 2, the cathode strips on the first substrate are located in non-overlapping regions with the cathode strips on the second substrate to allow a clear optical path for the light emitted from the overlying substrate. Alternatively, the use of transparent cathodes is also useful.

For illustrative purposes, a two-color OLED device with two substrate layers is shown in FIG. 2. The active components on the upper substrate emit light of a different wavelength or color from the active components on the lower substrate. In another embodiment of the invention shown in FIG. 3, up to N individual substrates are stacked vertically to form an N-color display 400, where N is an integer number 1, 2, 3 . . . N. For example, a full color display can be formed with three primary colors red (R), green (G) and blue (B). The cathode strips on the different layers, in one embodiment, are positioned in non-overlapping regions to allow a clear optical path for the emitted light.

Figure 3:
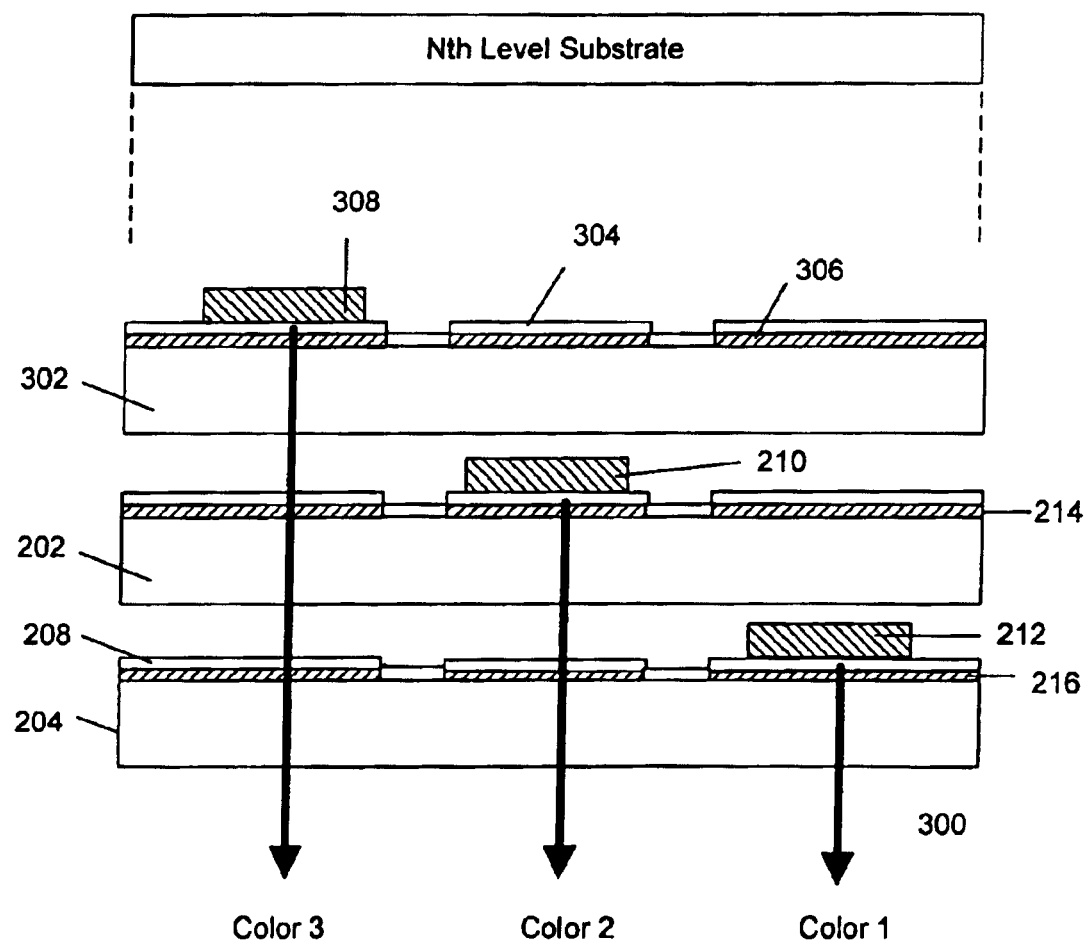
FIGS. 3–6 show various other multi-substrate OLED devices in accordance with different embodiments of the invention.

The amount of optical absorption exhibited by the organic material is dependent on the wavelength of light emitted by the material. Typically, the shorter the wavelength of the emitted light, the higher the absorption of light in the shorter wavelength range. Referring to FIG. 3, the substrates are stacked such is that material emitting light with the shortest wavelength is closest to the viewing surface. For example, colors 1, 2 and 3 can be blue, green and red respectively.

Figure 4:
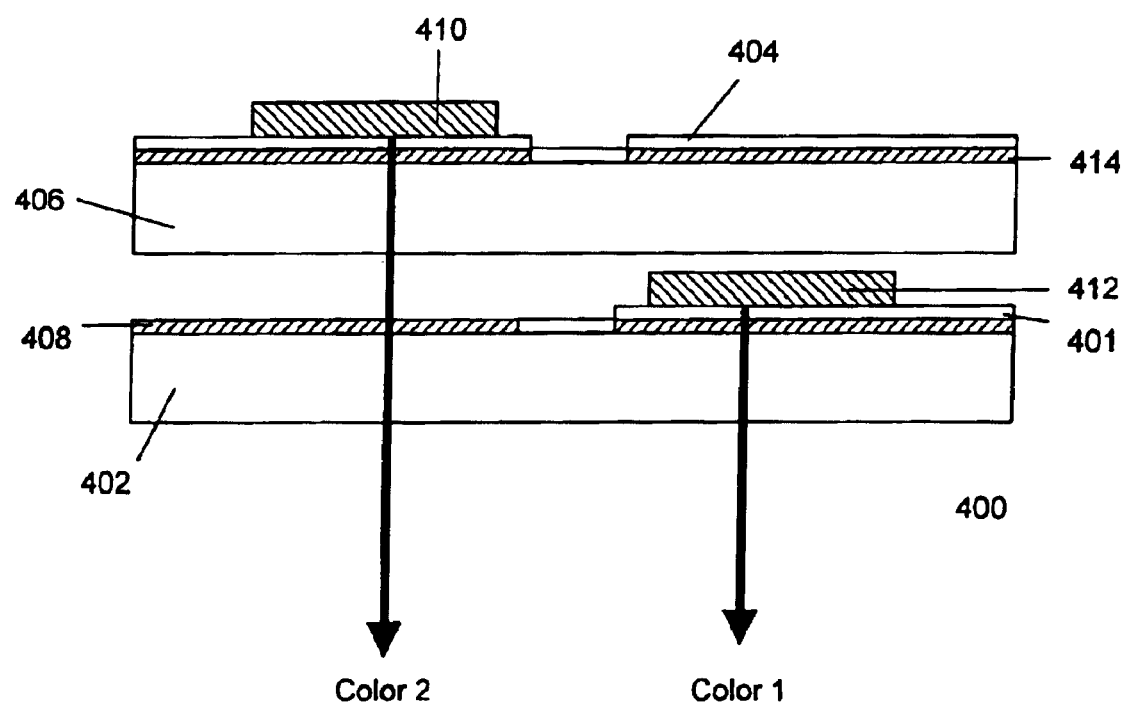

Alternatively, the organic layers can be selectively patterned to allow a clear optical path for all colors emitted from the upper layers. In one embodiment shown in FIG. 4, the organic functional layers 401 on the lower substrate 402 are patterned to allow an unobstructed optical path for light of color 2 emitted from the organic layers 404 on the upper substrate 406. The methods of patterning the organic layers include laser ablation and selective deposition.

Figure 5:
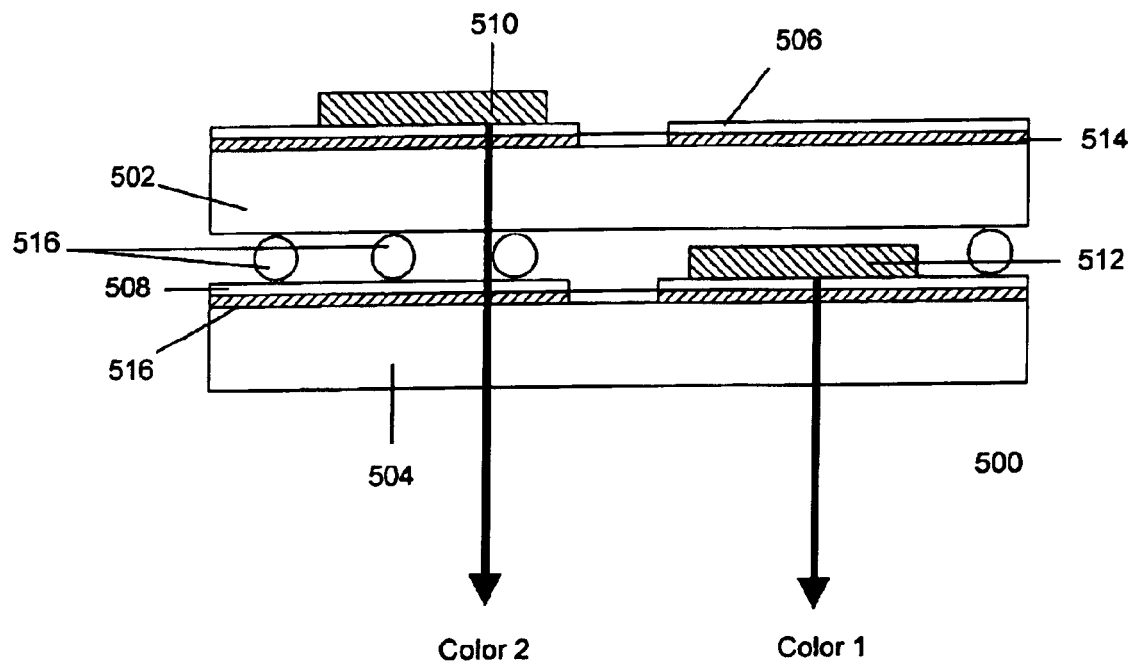

FIG. 5 shows another embodiment of the invention. Spacer particles 516 are randomly deposited between the upper substrate 502 and lower substrate 504 to prevent the overlying upper substrate from contacting the OLED cells 508 on the lower substrate 504. In one embodiment, the spacer particles comprise a spherical shape. Spacer particles having other geometric shapes, such as cubical, prism, pyramidal, or other regular or irregular shapes are also useful. The average mean diameter of the spacer particles is sufficient to maintain the desired height of the cavity between the upper and lower substrates, which for example is about 2–50 $\mu$m. The size and shape distribution of the spacer particles should be sufficiently narrow to ensure proper separation between the upper substrate and OLED cells and minimize parallax effects caused by different light emitting levels. The use of spacer particles to separate active OLED cells from other surfaces is described in international patent application titled "Encapsulation of Organic LED Devices" (PCT Application No. PCT/SG99/00143, Attorney Docket No. 99E2809SG), which is herein incorporated by reference for all purposes.

Figure 6:
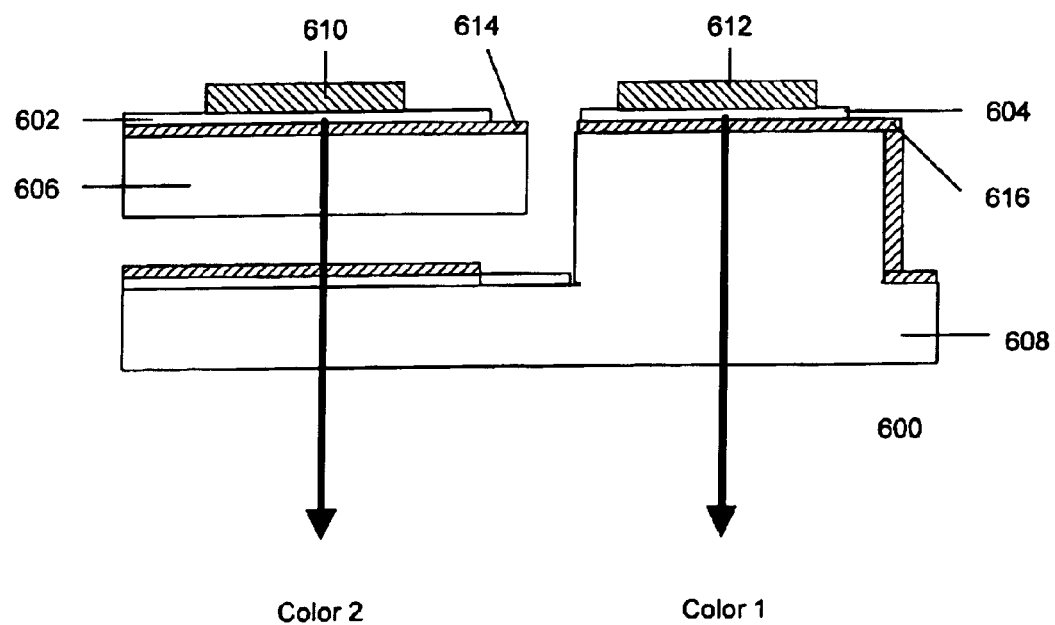

Another embodiment of the invention is shown in FIG. 6, whereby substrate surfaces are punctured and staggered to bring the emitting levels 602 and 604 to similar heights to minimize or avoid the problem of parallaxes caused by different emitting levels. In a preferred embodiment, the substrates comprise plastic material (e.g. polymeric foil) that is easily embossed and punctured. The staggered surfaces of the substrates 606 and 608 are achieved by various conventional techniques, including substrate machining, embossing techniques and selective deposition of substrate layers with different thickness.

Figure 7:
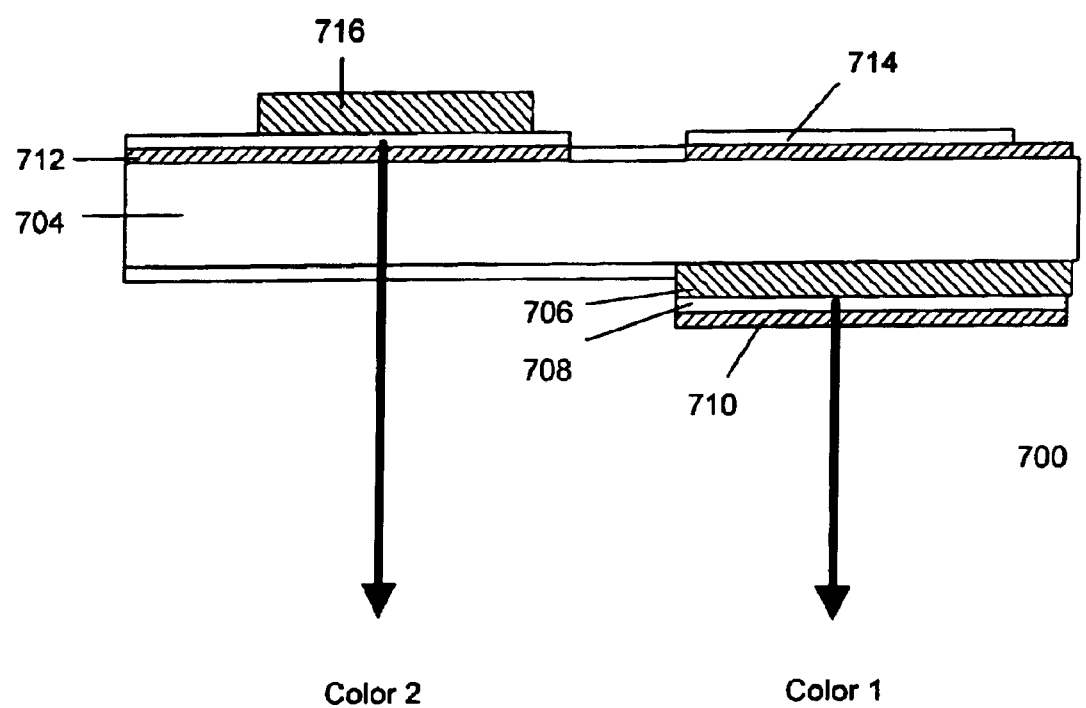
FIG. 7 shows a double-sided OLED device in accordance to another embodiment of the invention.

Alternatively, different emitting organic materials can be distributed on both surfaces of the substrate, as shown in FIG. 7. In a preferred embodiment, the double-sided substrate OLED device 700 is formed by a reverse construction of device layers on the lower surface of the substrate 704, wherein the opaque conductive cathode layer 706 is formed before the formation of the active organic function layers 708 and anode layer 710. On the upper surface of the substrate, the conductive anode layer 712 is deposited first, followed by the formation of organic function layers 714 and conductive cathode layer 716. The light emission on both sides of the substrate is different in color, efficiency and geometry.

The previously described embodiments of the invention have many advantages. For example, since the fabrication of OLED devices with multiple substrates or multiple surfaces is very similar to the standard single substrate monochrome OLED device, known optimized processes developed for the fabrication of the standard OLED devices can be utilized. The emission intensity of each color can be individually controlled by electrical signals. Difference active materials exhibiting different properties like efficiency, stability and price can be combined in a single OLED device to utilize the specific advantages offered by each active component. The light emission from multiple substrates or surfaces of the substrate is different in color, efficiency and geometry.

The performance of each color pixel is comparable to the values achieved by the simple monochrome display device. In addition, problems associated with the difficult combination and patterning of different organic materials on a single substrate surface can be avoided, resulting in low cost and more efficient fabrication, and hence higher throughput.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a plurality of substrates mounted vertically in a stacked structure; and
   active components arranged on each substrate of the plurality of substrates, the active components of each substrate emitting light of a given wavelength through the stacked structure towards a viewing surface, wherein the active components of different substrates are arranged in a non-overlapping pattern to allow non-overlapping vertical optical paths for the light emitted from the active components of different substrates, the active components are distributed on a surface of each substrate and the active components of different substrates emit light of different wavelengths; wherein the surface of each substrate is punctured and staggered bringing emitting levels of the active components of different substrates to similar heights.

2. The device of claim 1 wherein the substrates comprise a thickness of less than 0.5 mm.

3. The device of claim 1 wherein the substrates comprise glass or plastic.

4. The device of claim 1 wherein the active components comprise one or more organic layers sandwiched between first and second conductive layers, forming an organic light emitting diode device.

5. The device of claim 4 wherein the organic layers on said plurality of substrates comprise a non-overlapping pattern.

6. The device of claim 5 wherein the non-overlapping pattern of the organic layers comprises strips.

7. The device of claim 4 wherein each of the first and second conductive layers is about 0.02–1 $\mu$m thick.

8. The device of claim 4 wherein the first conductive layer comprises an opaque material.

9. The device of claim 8 wherein the first conductive layer comprises a metallic material.

10. The device of claim 8 wherein the first conductive layer on said plurality of substrates comprises a non-overlapping pattern.

11. The device of claim 10 wherein the pattern of the first conductive layer comprises strips.

12. The device of claim 10 wherein the organic layers on said plurality of substrates comprise a non-overlapping pattern.

13. The device of claim 12 wherein the non-overlapping pattern of the organic layers comprises strips.

14. A device comprising:
   a plurality of transparent substrates mounted vertically in a stacked structure; and
   active components arranged on a first surface of each substrate of the plurality of transparent substrates, the active components emitting light of a given color through the active component's corresponding substrate towards a viewing surface, wherein the active components of different substrates are arranged in a non-overlapping pattern to allow non-overlapping vertical optical paths for the light emitted from the active components of the different substrates.

15. The device of claim 14, wherein:
   the active components include one or more organic layers sandwiched between first and second conductive layers.

16. The device of claim 14, wherein the transparent substrates comprise a thickness of less than 0.5 mm.

17. The device of claim 14 wherein the substrates comprise glass or plastic.

18. The device of claim 14 wherein the active components comprise one or more organic layers sandwiched between first and second conductive layers, forming an organic light emitting diode device.

19. The device of claim 18 wherein the organic layers on said plurality of substrates comprise a non-overlapping pattern.

20. The device of claim 19 wherein the non-overlapping pattern of the organic layers comprises strips.

21. The device of claim 18 wherein each of the first and second conductive layers is about 0.02–1 $\mu$m thick.

22. The device of claim 18 wherein the first conductive layer comprises an opaque material.

23. The device of claim 22 wherein the first conductive layer comprises a metallic material.

24. The device of claim 22 wherein the first conductive layer on said plurality of substrates comprises a non-overlapping pattern.

25. The device of claim 24 wherein the pattern of the first conductive layer comprises strips.

26. The device of claim 24 wherein the organic layers on said plurality of substrates comprise a non-overlapping pattern.

27. The device of claim 26 wherein the non-overlapping pattern of the organic layers comprises strips.

* * * * *